United States Patent [19]
Ohoka

[11] Patent Number: 5,593,915
[45] Date of Patent: Jan. 14, 1997

[54] METHOD OF MANUFACTURING SEMICONDUCTOR DEVICE

[75] Inventor: Tsukasa Ohoka, Tokyo, Japan

[73] Assignee: NEC Corporation, Tokyo, Japan

[21] Appl. No.: 301,183

[22] Filed: Sep. 6, 1994

[30] Foreign Application Priority Data

Sep. 9, 1993 [JP] Japan .................................. 5-224316

[51] Int. Cl.⁶ ........................ H01L 21/302; H01L 21/20; H01L 21/76; H01L 21/306
[52] U.S. Cl. .............................. 437/62; 437/86; 437/979; 148/DIG. 12; 148/DIG. 135
[58] Field of Search .................................. 437/21, 56, 57, 437/62, 979, 86, 69; 148/DIG. 12, DIG. 135

[56] References Cited

U.S. PATENT DOCUMENTS 5,072,277  12/1991  Sakakibara et al. ...................... 357/42
5,384,473  1/1995  Yoshikawa et al. ..................... 257/255

FOREIGN PATENT DOCUMENTS

1-144665  6/1989  Japan .

*Primary Examiner*—Mary Wilczewski
*Assistant Examiner*—Brian K. Dutton
*Attorney, Agent, or Firm*—Laff, Whitesel, Conte & Saret, Ltd.

[57] ABSTRACT

A method of manufacturing a semiconductor device includes the following steps. A silicon oxide film having a predetermined film thickness is formed on a smooth major surface of a first silicon substrate of a first conductivity type having a first region wherein a power transistor is to be formed. The major surface of the first silicon substrate is bonded to a smooth major surface of a second silicon substrate having one of the first conductivity type and a second conductivity type. The other surface of the second silicon substrate bonded to the first silicon substrate is polished to form a silicon layer having a predetermined film thickness and a second region wherein a transistor constituting a control circuit for driving the power transistor is to be formed. The silicon layer and the silicon oxide film are removed from a predetermined portion in the first region. The power transistor of a vertical type is formed on the silicon substrate in the first region wherein the silicon layer and the silicon oxide film are selectively removed. The transistor constituting the control circuit is formed on the silicon layer on the silicon oxide film in the second region.

11 Claims, 7 Drawing Sheets

METHOD OF MANUFACTURING SEMICONDUCTOR DEVICE

BACKGROUND OF THE INVENTION

The present invention relates to a method of manufacturing a semiconductor device and, more particularly, to a method of manufacturing a semiconductor device which comprises a power transistor, and a transistor constituting a control circuit, and is formed on an SOI (Silicon On Insulator) type bulk substrate.

It is difficult to form, as one chip, a power transistor and a transistor constituting a control circuit for driving the power transistor on the same major surface of a silicon substrate in view of dielectric isolation. A method of manufacturing a semiconductor device in which a power transistor and a transistor constituting a control circuit are formed as one chip using an SOI type bulk substrate is disclosed in Japanese Patent Laid-Open No. 1-144665.

Figures 5A, 5B, 5C, 5D:
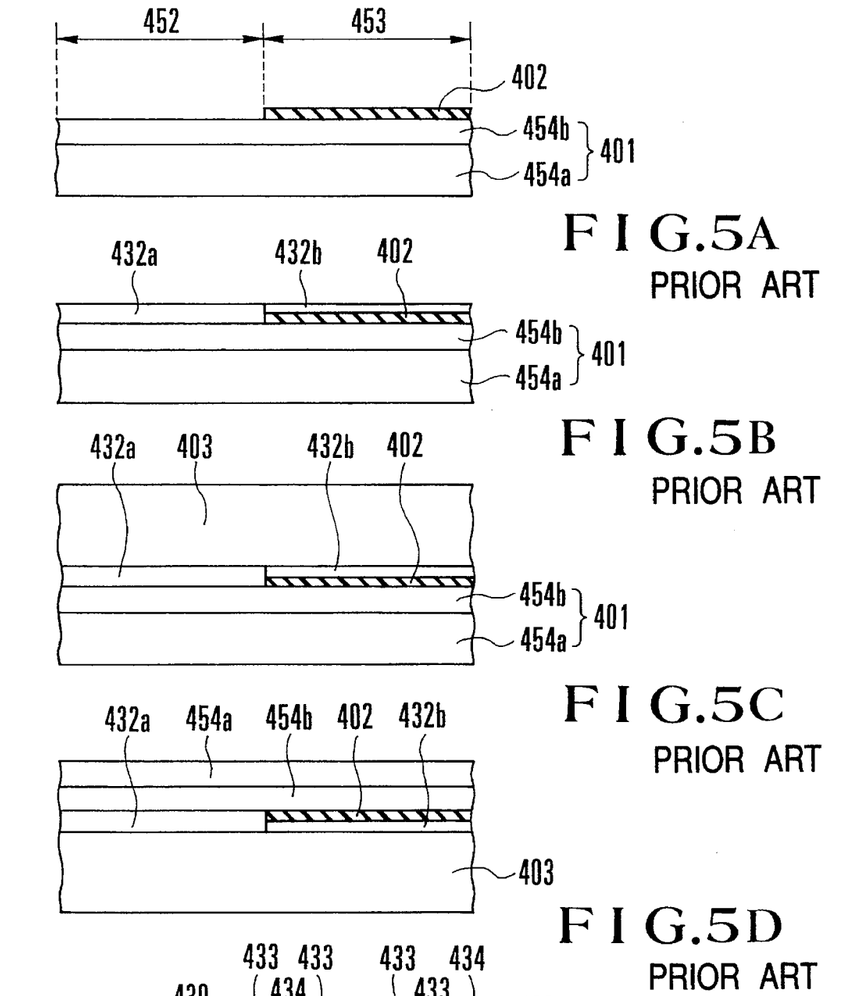
FIGS. 5A to 5E are sectional views showing the conventional steps in manufacturing a semiconductor device.

FIGS. 5A to 5E show the conventional steps in manufacturing a semiconductor device. Referring to FIGS. 5A to 5E, in a method of manufacturing a semiconductor device described in the above document, an $n^+$-type epitaxial silicon layer 454b having a smooth surface is stacked on the major surface of an $n^-$-type silicon base 454a to form a first silicon substrate 401. A silicon oxide film 402 is formed on the surfaces of the first silicon substrate 401 by thermal oxidation. The silicon oxide film 402 in a first region 452 on the major surface of the first silicon substrate 401 wherein a power transistor is to be formed, and the silicon oxide film 402 covering the remaining surfaces, except for the major surface, of the first silicon substrate 401 are removed. At this time, the silicon oxide film 402 in a second region 453, except for the first region 452, on the major surface of the first silicon substrate 401 remains (FIG. 5A).

Silicon is epitaxially grown to form an $n+$-type epitaxial silicon layer 432a in the first region 452 on the first silicon substrate 401 and an $n^+$-type polysilicon layer 432b in the second region 453 on the silicon oxide film 402. In this stage, since a stepped portion exists, the silicon layer is planished to eliminate this stepped portion and smooth the surface of the resultant structure. With this process, the $n^+$-type epitaxial silicon layer 432a and the $n^+$-type polysilicon layer 432b are respectively formed in the predetermined regions on the major surface of the first silicon substrate 401 (FIG. 5B). The planished major surface of an $n^+$-type second silicon substrate 403 is bonded to the major surface of the first silicon substrate 401, and the resultant structure is annealed at a temperature of 900° C. or more, thereby obtaining a bulk substrate partially having an SOI structure (FIG. 5C). The other surface, opposite to the major surface, of the first silicon substrate 401 is planished to form an $n^-$-type silicon layer 454aa consisting of the silicon base 454a and having a predetermined film thickness (FIG. 5D). Note that FIG. 5D shows that the top and bottom of FIG. 5C showing the first and second silicon substrates 401 and 403 are reversed.

Figure 5E:
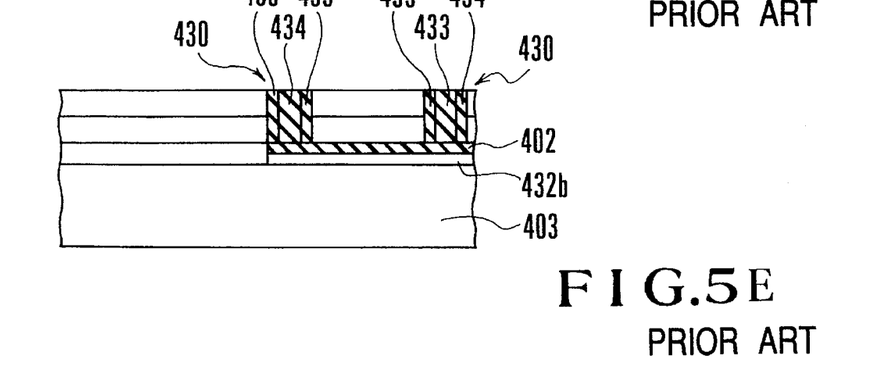

The $n^-$-type silicon layer 454aa and the $n^+$-type epitaxial silicon layer 454b are removed from predetermined portions in the second region 453 to form a groove 430 reaching the silicon oxide film 402. A silicon oxide film 433 is formed on the side surfaces of the groove 430, and a polysilicon film 434 is filled in the groove 430, thereby completing an element isolation region (FIG. 5E). A vertical n-channel power MOSFET is formed in the first region 452, and a control circuit comprising a p-channel MOSFET and the like is formed in the isolated second region 453.

The conventional method of manufacturing a semiconductor device described above has a problem in formation of a bulk substrate. That is, assume that the surface constituted by the $n^+$-type epitaxial silicon layer 432a and the $n^+$-type polysilicon layer 432b and having the stepped portion is polished to form the $n^+$-type epitaxial silicon layer 432a and the $n^+$-type polysilicon layer 432b on the same plane shown in FIG. 5B. Since the hardness of the $n^+$-type epitaxial silicon layer 432a is different from that of the $n^+$-type polysilicon layer 432b, it is difficult to make the surface constituted by the $n^+$-type epitaxial silicon layer 432a and the $n^+$-type polysilicon layer 432b a smooth mirror surface. Therefore, the manufacturing yield of a bulk substrate is low.

Furthermore, the conventional method of manufacturing a semiconductor device has problems that the step of forming the element isolation region in the second region 453 is complicated, and the manufacturing cost is high.

SUMMARY OF THE INVENTION

It is an object of the present invention to provide a method of manufacturing a semiconductor device in which a bulk substrate is easily manufactured, and the manufacturing yield is high.

It is another object of the present invention to provide a method of manufacturing a semiconductor device in which the step of forming an element isolation region is simple, and the manufacturing cost is low.

In order to achieve the above objects, according to the present invention, there is provided a method of manufacturing a semiconductor device comprising the steps of forming a silicon oxide film having a predetermined film thickness on a smooth major surface of a first silicon substrate of a first conductivity type having a first region wherein a power transistor is to be formed, bonding the major surface of the first silicon substrate and a smooth major surface of a second silicon substrate having one of the first conductivity type and a second conductivity type, polishing the other surface of the second silicon substrate bonded to the first silicon substrate to form a silicon layer having a predetermined film thickness and a second region wherein a transistor constituting a control circuit for driving the power transistor is to be formed, removing the silicon layer and the silicon oxide film from a predetermined portion in the first region, forming the power transistor of a vertical type on the silicon substrate in the first region wherein the silicon layer and the silicon oxide film are selectively removed, and forming the transistor constituting the control circuit on the silicon layer on the silicon oxide film in the second region.

Description of the Preferred Embodiments

The present invention will be described in detail with reference to the accompanying drawings.

FIGS. 1A to 1D and FIGS. 2A to 2C show the steps in manufacturing a semiconductor device according to the first embodiment of the present invention. In the first embodiment, a vertical n-channel power MOSFET is formed in a first region 152, and a CMOS (Complementary Metal Oxide Semiconductor) transistor constituting a control circuit is formed in a second region 153. They are manufactured as follow.

Figures 1A, 1B, 1C:
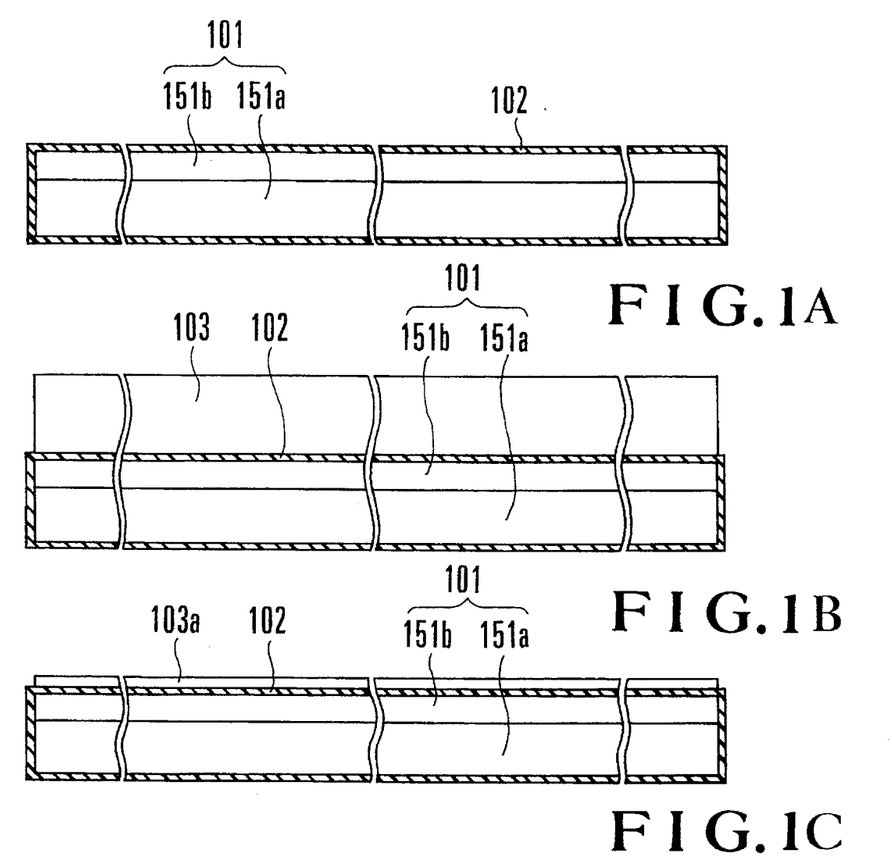
FIGS. 1A to 1D are sectional views showing the steps in manufacturing a semiconductor device according to the first embodiment of the present invention.

A first silicon substrate 101 is constituted by an n-type silicon base 151a having a plane orientation of (100) and the planished major surface, and an n$^-$-type epitaxial silicon layer 151b formed on this major surface and having a predetermined film thickness and a resistivity of about 1 to 5 Ω·cm. A silicon oxide film 102 having a film thickness of about 50 to 100 nm is formed on the surfaces of the first silicon substrate 101 by thermal oxidation (FIG. 1A). After a hydrophilic treatment is performed, the major surface of the first silicon substrate 101 is joined and bonded to the planished smooth major surface of an n-type second silicon substrate 103 at room temperature. The resultant structure is annealed at a temperature of 900° C. or more, and voids of this bonded surface are removed to increase a bonding strength (FIG. 1B). The other surface, opposite to the major surface, of the second silicon substrate 103 is planished to form an n-type silicon layer 103a consisting of the second silicon substrate 103 and having a film thickness of about 0.5 to 1.0 μm (FIG. 1C).

Figure 1D:
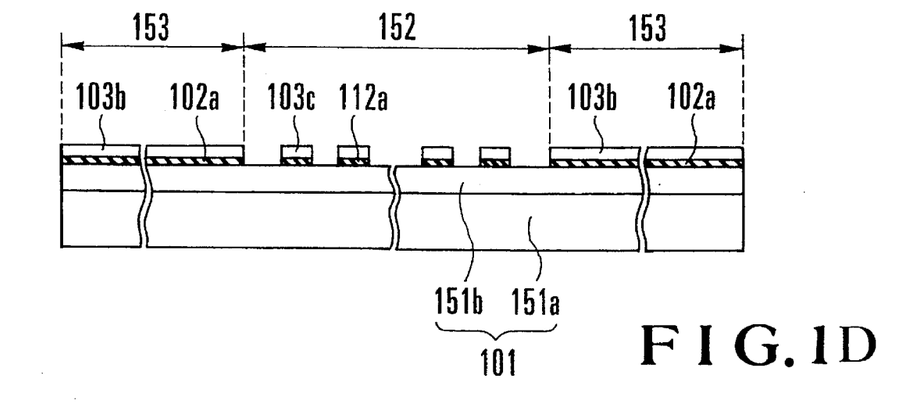

After the silicon oxide film 102 except for the one on the bonded surface is removed by wet etching, the silicon layer 103a and the silicon oxide film 102 are subsequently removed by a well-known photolithographic step and RIE (Reactive Ion Etching) from predetermined portions in the first region 152 wherein the vertical n-channel power MOSFET is to be formed. With this procedure, gate oxide films 112a each constituted by the silicon layer 103c and the silicon oxide film 102 remain in the first region 152. The gate oxide films 112a exist only immediately under the silicon layers 103c. On the other hand, a silicon layer 103b and a silicon oxide film 102a remain in the second region 153, except for the first region 152, wherein the CMOS transistor constituting a control circuit is to be formed (FIG. 1D).

Figure 2A:
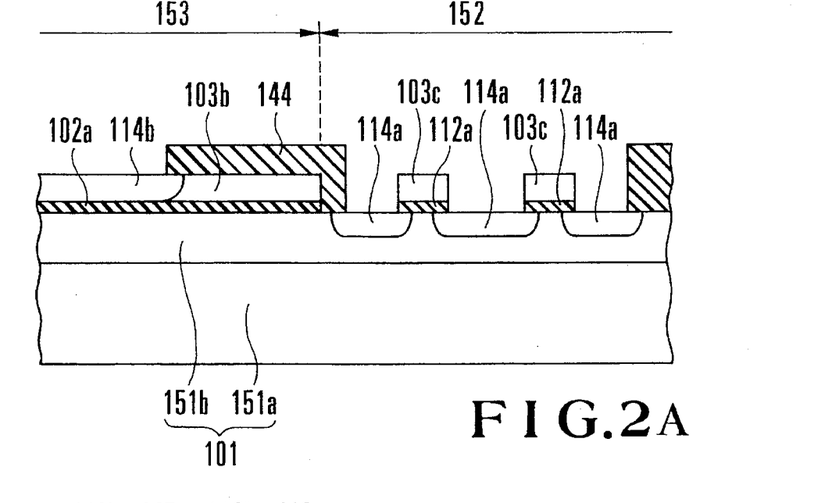
FIGS. 2A to 2C are partial sectional views showing the steps in manufacturing the semiconductor device according to the first embodiment of the present invention.

P-type base regions 114a are formed in the surface of the epitaxial silicon layer 151b in the first region 152 by ion implantation using a photoresist film 144 and the silicon layers 103c as masks. A p-type well 114b is selectively formed in the silicon layer 103b in the second region 153 (FIG. 2A).

After an insulating interlayer is deposited on the entire surface of the resultant structure, the obtained structure is patterned to form an insulating interlayer 145a. Thermal oxidation is performed to selectively form gate oxide films 112b on the surfaces of the silicon layer 103b and the p-type well 114b in the second region 153. At this time, silicon oxide films 112c are also formed on the exposed surfaces of the p-type base regions 114a and the silicon layers 103c.

Figure 2B:
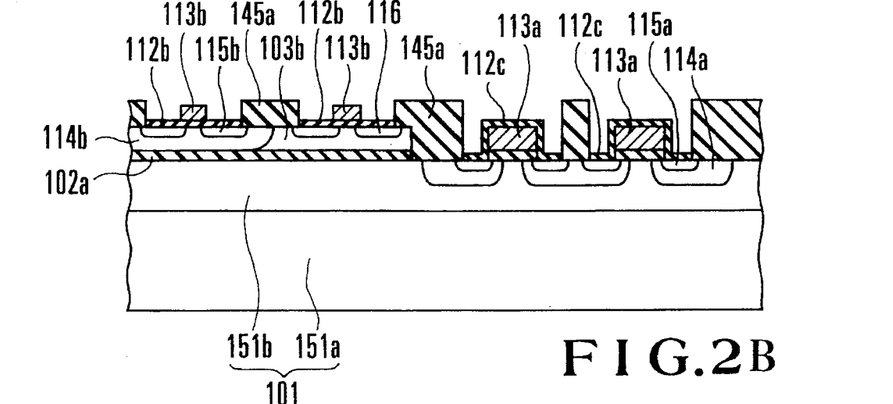
Figure 2C:
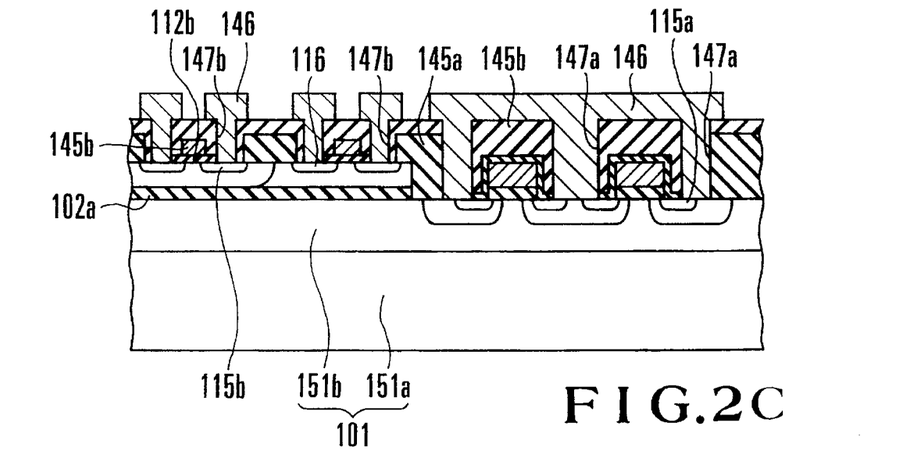

Gate electrodes 113b each constituted by, e.g., an n$^+$-type polysilicon film are formed on the gate oxide films 112b and the like in the second region 153. Thereafter, by a well-known manufacturing method, n$^+$-type source regions 115a for the power MOSFET are formed in the surfaces of the p-type base regions 114a, and n$^+$-type source/drain regions 115b for an n-channel MOSFET are formed in the surface of the p-type well 114b. At this time, each silicon layer 103c constitutes an n$^+$-type gate electrode 113a. Furthermore, p$^+$-type source/drain regions 116 for the p-channel MOSFET are formed in the surface of each silicon layer 103b (FIG. 2B). After an insulating interlayer 145b is formed on the first and second regions 152 and 153, openings 147a and 147b are formed at predetermined portions in the first and second regions. Aluminum electrodes 146 are formed in the openings 147a and 147b and the peripheries thereof, and the manufacture of the semiconductor device is finished (FIG. 2C).

In the first embodiment, since the surface of the silicon oxide film 102 is smooth, the yield of forming the bulk substrate is high. Since the CMOS transistor constituting a control circuit is dielectrically isolated from the power MOSFET by the silicon oxide film 102a, the dielectric isolation is realized by simple manufacturing steps, and the problem in high manufacturing cost is solved.

Although the CMOS transistor is formed in the second region 153 in the first embodiment, a BiCMOS transistor may be formed. Although the second silicon substrate 103 is an n type in the first embodiment, a p-type substrate may be used as the second silicon substrate 103. In this case, an n-type well is to be formed instead of the p-type well.

FIGS. 3A to 3J show the steps in manufacturing a semiconductor device according to the second embodiment of the present invention. In the second embodiment of the present invention, as in the first embodiment, a vertical n-channel power MOSFET is formed in a first region 252, and a CMOS constituting a control circuit is formed in a second region 253. The first difference between the second embodiment and the first embodiment is that the film thickness of a silicon oxide film 202 bonding a first silicon substrate 201 and a second silicon substrate 203 is smaller in the first region 252 as compared with that in a remaining portion. The silicon oxide film 202 in the first region 252 constitutes a gate oxide film for the power MOSFET. The second difference is that a p-type well 214 is formed prior to forming a p-type base region for the power MOSFET to allow a LOCOS (LOCal Oxidation of Silicon) type field oxide film 243 to be formed in the second region 253 wherein the CMOS transistor is to be formed. The manufacturing method according to this embodiment is as follow.

Figure 3A:
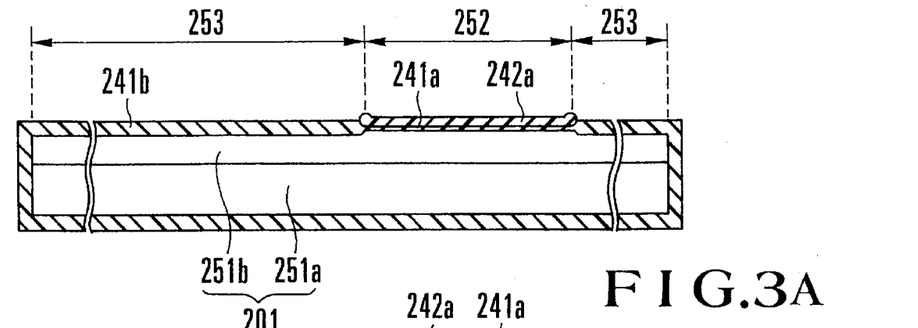
FIGS. 3A to 3J are sectional views showing the steps in manufacturing a semiconductor device according to the second embodiment of the present invention.
Figure 3B:
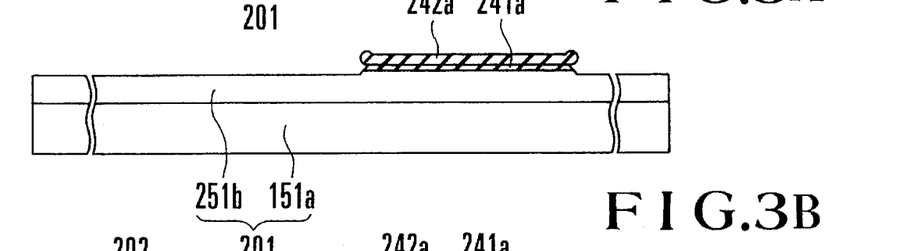
Figure 3C:
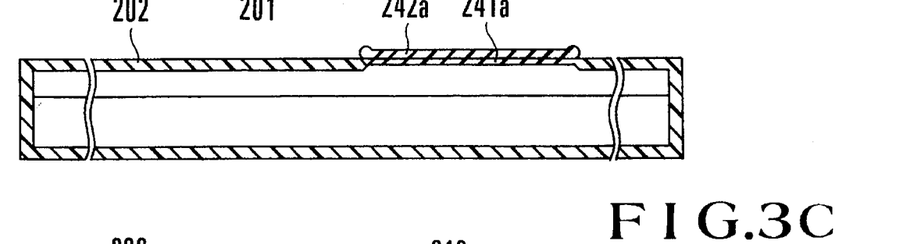

A first silicon substrate 201 is constituted by an n-type silicon base 251a having a plane orientation of (100) and the planished major surface, and an n$^-$-type epitaxial silicon layer 251b formed on this major surface and having a predetermined film thickness and a resistivity of about 1 to 5 Ω·cm. A silicon oxide film 241a is formed on the surface of the first silicon substrate 201, and a silicon nitride film 242a is selectively formed in the first region 252 on the major surface of the first silicon substrate 201. A LOCOS type silicon oxide film 241b is formed in the second region 253 and on the remaining surfaces, except for the major surface, of the first silicon substrate 201 by a well-known selective oxidation method (FIG. 3A). The silicon oxide film 241b except in the first region 252 is removed by wet etching (FIG. 3B). The LOCOS type silicon oxide film 202 is formed on the second region 253 and the like again by the well-known selective oxidation method (FIG. 3C).

Figure 3D:
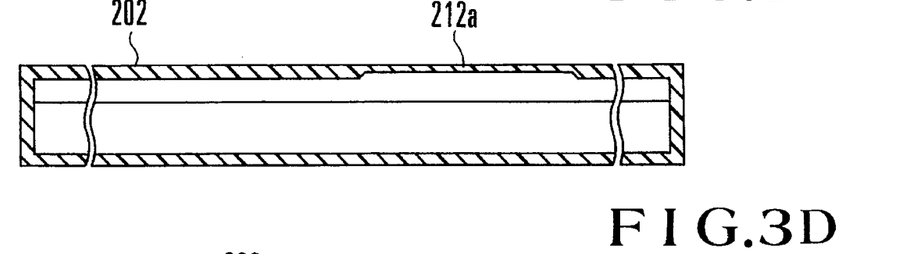

After the silicon nitride film 242a and the silicon oxide film 241a are subsequently removed by wet etching, a gate oxide film 212a is formed in the first region 252 by thermal oxidation. The upper surface level of the silicon oxide film 202 can easily coincide with that of the gate oxide film 212a by properly selecting the film thicknesses of the silicon oxide films 241a, 241b, and 202 and the gate oxide film 212a. A projecting portion by a bird's beak formed at the boundary between the silicon oxide film 202 and the gate oxide film 212a is removed by polishing (FIG. 3D). This polishing is easily performed as compared with the polishing described in the above document. This is because both of the silicon oxide film 202 and the gate oxide film 212a are silicon oxide films by thermal oxidation, and the hardnesses of them are equal to each other.

Figure 3E:
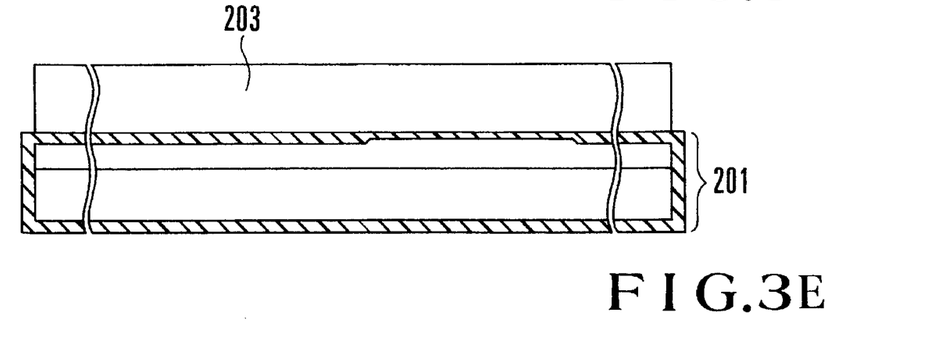
Figure 3F:
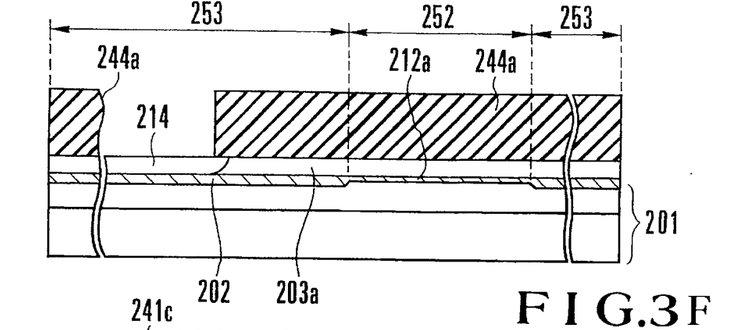

According to the same method as in the first embodiment, the major surface of the n-type second silicon substrate 203 is joined and bonded to the major surface of the first silicon substrate 201 through the silicon oxide film 202 and the gate oxide film 212a (FIG. 3E). The other surface, opposite to the major surface, of the second silicon substrate 203 is polished to form an n-type silicon layer 203a having a predetermined film thickness. A p-type well 214 is formed in the silicon layer 203a in the second region 253 by ion implantation using a photoresist film 244a as a mask (FIG. 3F).

Figure 3G:
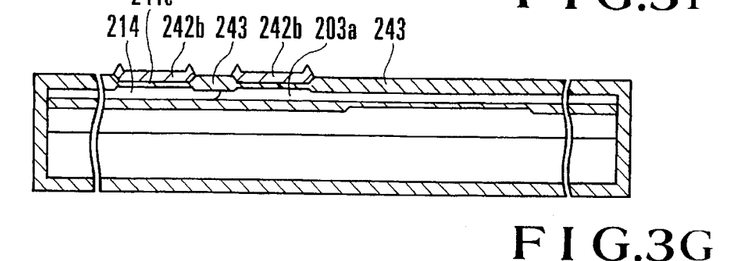
Figure 3H:
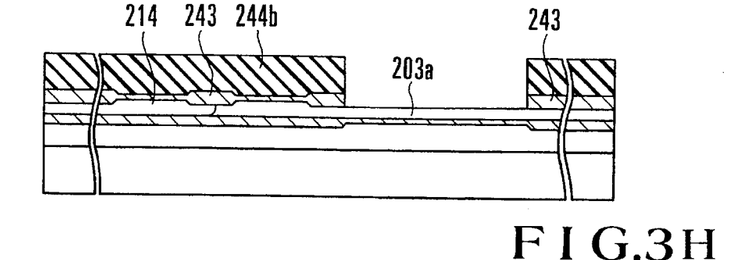
Figure 3I:
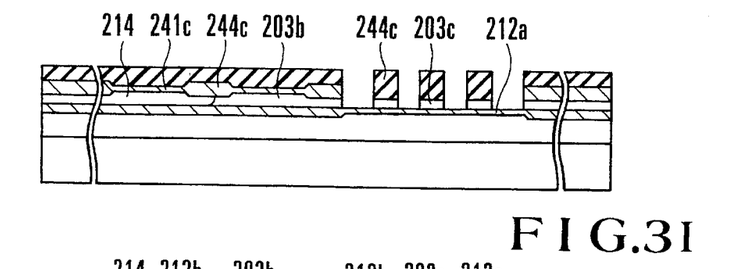
Figure 3J:
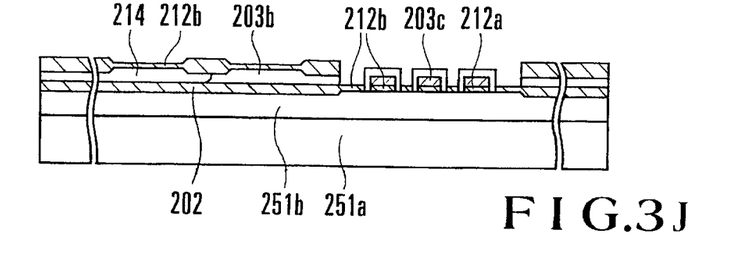

The LOCOS type field oxide film 243 is formed on the surfaces of the silicon layer 203a and portions on the p-type well 214b as an element isolation region between a plurality of elements in the second region 253, the surface of the silicon layer 203a in the first region 252, and the like by the selective oxidation method using silicon oxide films 241c and silicon nitride films 242b as masks (FIG. 3G). The field oxide film 243 except in the second region 253 is removed by wet etching using a photoresist film 244b as a mask (FIG. 3H). The silicon layer 203a is removed from predetermined portions in the first region 252 by RIE using a photoresist film 244c as a mask. With this process, silicon layers 203c remain in the first region 252, and a silicon layer 203b remains in the second region 253 (FIG. 3I). The silicon oxide films 241c and the exposed portions of the gate oxide film 212a are removed by wet etching. Thermal oxidation is performed again, and gate oxide films 212b are formed on the p-type well 214b and the silicon layer 203b in the second region 253, the surfaces of the silicon layers 203c in the first region 252, and the like.

P-type base regions (not shown) are formed on the surface of the n⁻-type epitaxial silicon layer 251b. The following manufacturing steps are the same as in the first embodiment. Note that the p-type base regions may be formed by ion implantation using the photoresist film 244c as a mask after the silicon layers 203c are formed to remain.

In the second embodiment, different from the first embodiment, the film thickness of the silicon oxide film 202 which functions as dielectric isolation between the CMOS constituting a control circuit and the power MOSFET is not uniquely determined in accordance with the film thickness of the gate oxide film for the power MOSFET. For this reason, the CMOS and the power MOSFET are completely dielectrically isolated, and design freedom is increased. In addition, element isolation in the CMOS constituting a control circuit is better than that in the first embodiment.

FIGS. 4A to 4E show the steps in manufacturing a semiconductor device according to the third embodiment of the present invention. In the third embodiment of the present invention, a vertical npn bipolar power transistor is formed in a first region 352, and a control circuit comprising a vertical npn bipolar transistor and a lateral pnp bipolar transistor is formed in a second region 353. The manufacturing method according to this embodiment is as follow.

Figure 4A:
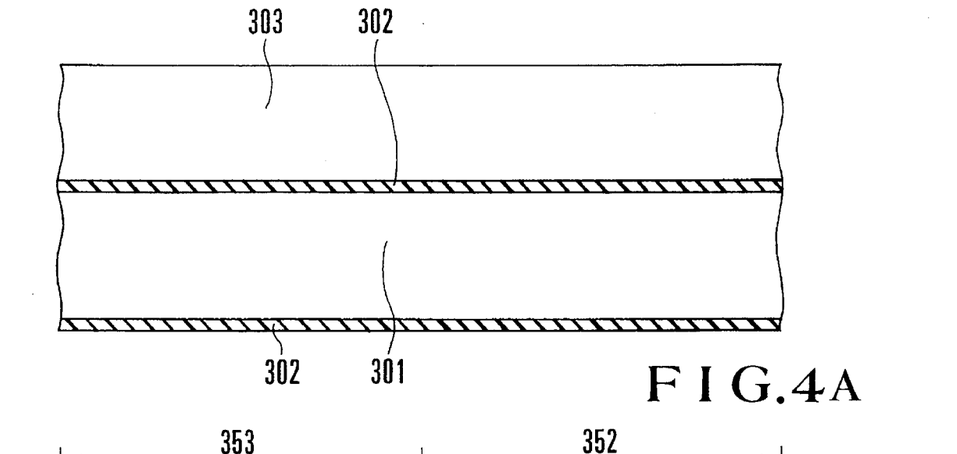
FIGS. 4A to 4E are partial sectional views showing the steps in manufacturing a semiconductor device according to the third embodiment of the present invention.
Figure 4B:
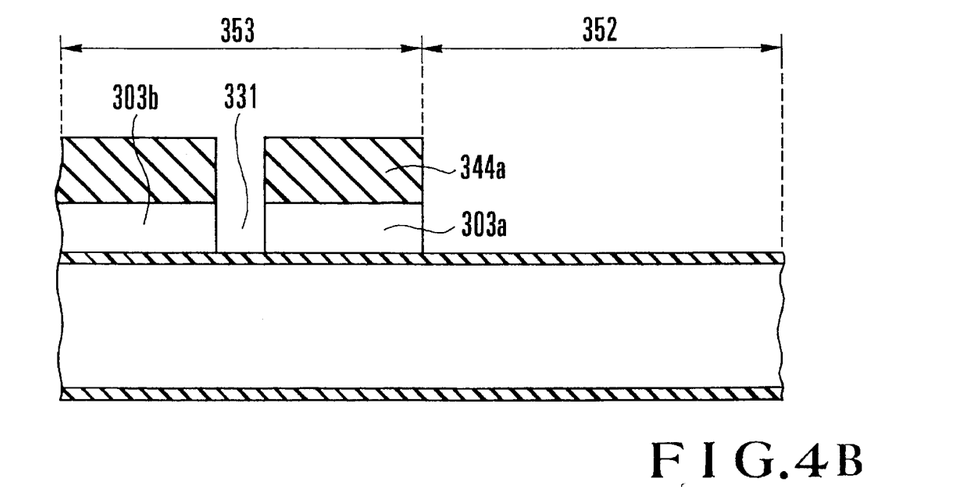
Figure 4C:
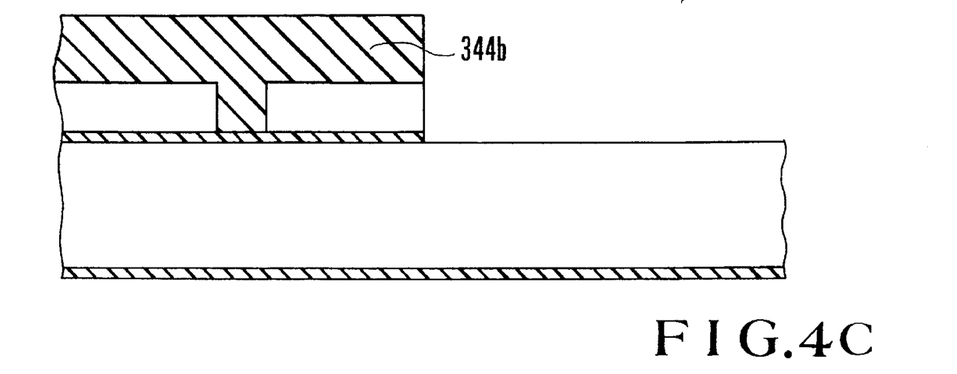

An n-type first silicon substrate 301 having the planished major surface is thermally oxidized, and a silicon oxide film 302 having a predetermined film thickness is formed on the surfaces. Following the same procedures as in the first embodiment, the major surface of an n⁻-type second silicon substrate 303 is joined and bonded to the silicon oxide film 302 (FIG. 4A). The other surface, opposite to the major surface, of the second silicon substrate 303 is polished to form a silicon layer having a predetermined film thickness. By RIE using a photoresist film 344a as a mask, the silicon layer constituting the second silicon substrate 303 is removed from the first region 352, and the silicon layer is removed from an element isolation region in the second region 353 to form an element isolation groove 331. Silicon layers 303a and 303b remain (FIG. 4B). The silicon oxide film 302 except for the one in the second region 353 is removed by wet etching with respect to the silicon oxide film using a photoresist film 344b which covers at least the element isolation groove 331 as a mask (FIG. 4C).

Figure 4D:
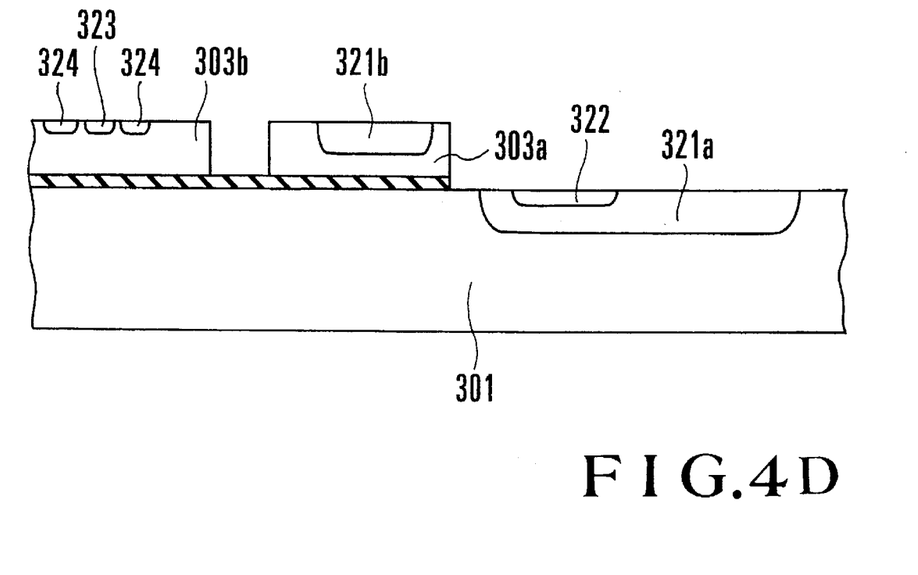
Figure 4E:
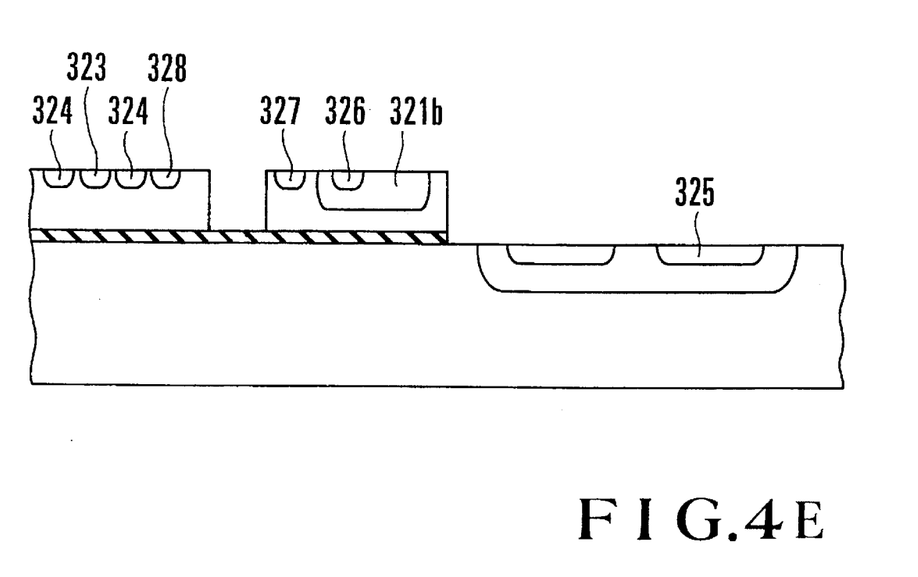

By a well-known ion implantation method or the like, a p⁻-type base region 321a is formed in the surface of the silicon substrate 301 in the first region 352, and a p⁻-type base region 321b is formed in the surface of the silicon layer 303a in the second region 353. Moreover, by the well-known ion implantation method or the like, a p⁺-type base extraction region 322 is formed in the surface of the p⁻-type base region 321a, and a p⁺-type emitter region 323 and p⁺-type collector regions 324 are formed in the surface of the silicon layer 303b (FIG. 4D). Similarly, an n⁺-type emitter region 325 is formed in the surface of the p⁻-type base region 321a, and an n⁺-type emitter region 326 is formed in the surface of the p⁻-type base region 321b. An n⁺-type collector extraction region 327 is formed in the surface of the silicon layer 303a, and an n⁺-type base extraction region 328 is formed in the surface of the silicon layer 303b (FIG. 4E). Thereafter, deposition of an insulating interlayer, formation of a connection opening, arrangement of an aluminum wiring, and the like are performed, and the semiconductor device according to this embodiment is completed.

In the third embodiment, the method of performing element isolation for the second region 353 wherein a control circuit is to be formed is better than those in the first and second embodiments.

When a vertical n-channel power MOSFET, and a CMOS transistor constituting a control circuit are respectively formed in the first and second regions 352 and 353, the step of forming the isolation groove 331 in the third embodiment can be applied. In the third embodiment, the vertical npn bipolar power transistor is formed using the n-type first silicon substrate 301. However, if a p-type substrate is to be applied as the first silicon substrate 301, a pnp-type bipolar power transistor can be formed in the first region 352.

As has been described above, in the method of manufacturing a semiconductor device according to the present invention, since the planished major surface of the first silicon substrate is joined and bonded to the planished major surface of the second silicon substrate through the silicon oxide film formed on the major surface of the first silicon substrate to form a bulk substrate, the formation yield of this bulk substrate is increased. In addition, since element isolation between the first region wherein the power transistor is formed and the second region wherein the transistor constituting a control circuit is formed is achieved by the silicon oxide film, the element isolation can be realized by simple manufacturing steps without increasing the manufacturing cost.

What is claimed is:

1. A method of manufacturing a semiconductor device comprising the steps of:

forming a silicon oxide film having a film thickness on a major surface of a first silicon substrate of a first conductivity type having a first region wherein a power transistor is to be formed;

bonding said major surface of said first silicon substrate and a major surface of a second silicon substrate having a conductivity type opposite said first conductivity type;

polishing the other surface of said second silicon substrate bonded to said first silicon substrate to form a silicon layer having a film thickness and a second region wherein a transistor constituting a control circuit for driving said power transistor is to be formed;

removing said silicon layer and said silicon oxide film from a portion in the first region;

forming said power transistor in the form of a vertical type on said silicon substrate in the first region, wherein said silicon layer and said silicon oxide film are removed;

the step of forming said silicon oxide film further comprising the added steps of:

making the silicon oxide film thickness in the first region on the major surface less thick than the film thickness of the silicon oxide in the second region on the other surface; and removing a projecting portion of a bird's beak formed at a boundary between said first and second regions by polishing to form a flat surface.

2. A method according to claim 1, wherein the step of making the silicon oxide film thickness in the first region on the major surface less thick comprises the steps of: forming a first silicon oxide film on said major surface of said first silicon substrate; forming a silicon nitride film in the first region on said first silicon substrate; forming a second silicon oxide film in the second region on said first silicon substrate by a first oxidation method using said silicon nitride film as a mask; removing said first and second silicon oxide films from the second region by wet etching; forming a third silicon oxide film of a local oxidation of silicon type in the second region on said first silicon substrate by a second oxidation method using said silicon nitride film as a mask; after said step of forming said third silicon oxide film removing said silicon nitride film and said first silicon oxide film from the first region by wet etching; and forming a silicon oxide film as a gate oxide film in the first region on said first silicon substrate by thermal oxidation.

3. A method according to claim 1, wherein a power MOSFET is formed in the first region, and a CMOS transistor is formed in the second region.

4. A method of manufacturing a semiconductor device comprising the steps of:

forming a silicon oxide film having a film thickness on a major surface of a first silicon substrate of a first conductivity type having a first region wherein a power transistor is to be formed;

bonding said major surface of said first silicon substrate and a major surface of a second silicon substrate having a conductivity type which is opposite said first conductivity type;

polishing the other surface of said second silicon substrate bonded to said first silicon substrate to form a silicon layer having a layer thickness and a second region wherein a transistor constituting a control circuit for driving said power transistor is to be formed;

removing said silicon layer from a portion in the first region and said silicon layer from an element isolation region which is to be formed at a portion in the second region to form an element isolation groove by removing said silicon layer from the element isolation region;

removing said silicon oxide film from a portion in the first region;

forming said power transistor in the form of a vertical type on said silicon substrate in the first region wherein said silicon layer and said silicon oxide film are removed;

forming said transistor constituting said control circuit on said silicon layer on said silicon oxide film in the second region; and the step of forming said silicon oxide film further comprising the added steps of:

making the silicon oxide film thinner in the first region than in the second region, and removing a projecting portion of a bird's beak formed at a boundary between the first and second regions by polishing to form a flat surface.

5. A method according to claim 4, wherein the step of forming said transistor constituting said control circuit comprises the step of forming a well region having said conductivity which is opposite to said first conductivity type in said silicon layer at the portion in the second region.

6. A method according to claim 4, wherein a power MOSFET is formed in the first region, and a CMOS transistor is formed in the second region.

7. A method of manufacturing a semiconductor device comprising the steps of:

forming a first silicon oxide film on a major surface of a first silicon substrate of a first conductivity type wherein a power transistor is to be formed;

bonding the major surface of said first silicon substrate and a first major surface of a second silicon substrate;

polishing the other surface of said second silicon substrate bonded to said first silicon substrate in order to form a first silicon layer wherein a CMOS transistor constituting a control circuit for driving said power transistor is to be formed;

forming a gate oxide film and a second silicon layer on said gate oxide film in a first region of said first silicon substrate, and a second silicon oxide film and a third silicon layer on said second silicon oxide film in a second region of said first silicon substrate by removing portions of said first silicon layer and a first silicon oxide film, said second region being adjacent to said first region, said second silicon oxide dielectrically isolating said transistor constituting the control circuit from said power transistor;

forming said power transistor in the form of a vertical type in the first region, said power transistor having a gate electrode which comprises said gate oxide film and second silicon layer; and forming said CMOS transistor on said third silicon layer on said second silicon oxide film in the second region.

8. A method according to claim 7, the step of forming said CMOS transistor comprising the further steps of:

forming a well region having a conductivity type which is opposite to a conductivity type of said second silicon substrate in a portion of said first silicon layer in the second region of said first silicon substrate; and forming a field oxide film on an element isolation region between said well region and first substrate.

9. A method according to claim 7, wherein said second silicon substrate has said first conductivity type.

10. A method according to claim 7, wherein said second silicon substrate has said second conductivity type which is opposite to a first conductivity type.

11. A method according to claim 7, wherein said power transistor is a power MOSFET transistor.

\* \* \* \* \*